United States Patent
Yang

(10) Patent No.: US 8,592,993 B2
(45) Date of Patent: Nov. 26, 2013

(54) METHOD AND STRUCTURE OF INTEGRATED MICRO ELECTRO-MECHANICAL SYSTEMS AND ELECTRONIC DEVICES USING EDGE BOND PADS

(71) Applicant: MCube Inc., San Jose, CA (US)

(72) Inventor: Xiao (Charles) Yang, Cupertino, CA (US)

(73) Assignee: mCube Inc., San Jose, CA (US)

( * ) Notice: Subject to any disclaimer, the term of this patent is extended or adjusted under 35 U.S.C. 154(b) by 0 days.

(21) Appl. No.: 13/751,014

(22) Filed: Jan. 25, 2013

(65) Prior Publication Data

US 2013/0134599 A1    May 30, 2013

Related U.S. Application Data

(62) Division of application No. 13/082,384, filed on Apr. 7, 2011, now Pat. No. 8,367,522.

(60) Provisional application No. 61/322,198, filed on Apr. 8, 2010.

(51) Int. Cl.
    *H01L 23/52*      (2006.01)
    *H01L 23/48*      (2006.01)
    *H01L 29/40*      (2006.01)

(52) U.S. Cl.
    USPC ............ 257/774; 257/E23.061; 257/688; 257/734; 257/735; 438/110; 438/113; 438/598

(58) Field of Classification Search
    USPC ............ 257/E21.211, E21.141, E23.061, 257/E23.078, E25.023, 666–690, 734–738, 257/773, 774; 438/106–110, 113, 121, 462, 438/598, 612
    See application file for complete search history.

(56) References Cited

U.S. PATENT DOCUMENTS

| | | | |
|---|---|---|---|
| 3,614,677 A | | 10/1971 | Wilfinger |
| 4,954,698 A | | 9/1990 | Yasunaga et al. |
| 5,140,745 A | * | 8/1992 | McKenzie, Jr. ............ 29/852 |
| 5,157,841 A | | 10/1992 | Dinsmore |
| 5,173,597 A | | 12/1992 | Anglin |
| 5,488,765 A | * | 2/1996 | Kubota et al. ............ 29/593 |
| 5,493,769 A | | 2/1996 | Sakai et al. |
| 5,610,414 A | | 3/1997 | Yoneda et al. |
| 5,668,033 A | | 9/1997 | Ohara |
| 5,729,074 A | | 3/1998 | Shiomi et al. |
| 6,046,409 A | * | 4/2000 | Ishii et al. ............... 174/255 |
| 6,076,731 A | | 6/2000 | Terrell |
| 6,115,261 A | | 9/2000 | Platt et al. |
| 6,188,322 B1 | | 2/2001 | Yao |
| 6,263,736 B1 | | 7/2001 | Thunder et al. |

(Continued)

*Primary Examiner* — Chris Chu
(74) *Attorney, Agent, or Firm* — Kilpatrick Townsend and Stockton LLP

(57) ABSTRACT

A monolithic integrated electronic device includes a substrate having a surface region and one or more integrated micro electro-mechanical systems and electronic devices provided on a first region overlying the surface region. Each of the integrated micro electro-mechanical systems and electronic devices has one or more contact regions. The first region has a first surface region. One or more trench structures are disposed within one or more portions of the first region. A passivation material overlies the first region and the one or more trench structures. A conduction material overlies the passivation material, the one or more trench structures, and one or more of the contact regions. The device also has one or more edge bond pad structures within a vicinity of the one or more bond pad structures, which are formed by a singulation process within a vicinity of the one or more bond pad structures.

10 Claims, 6 Drawing Sheets

(56) References Cited

U.S. PATENT DOCUMENTS

| | | | |
|---|---|---|---|
| 6,278,178 B1* | 8/2001 | Kwon et al. | 257/684 |
| 6,480,699 B1 | 11/2002 | Lovoi | |
| 6,483,172 B1 | 11/2002 | Cote | |
| 6,485,273 B1 | 11/2002 | Goodwin-Johansson | |
| 6,534,726 B1* | 3/2003 | Okada et al. | 174/263 |
| 6,576,999 B2* | 6/2003 | Sakai et al. | 257/730 |
| 6,753,664 B2 | 6/2004 | Neufeld et al. | |
| 6,855,572 B2* | 2/2005 | Jeung et al. | 438/106 |
| 6,912,336 B2 | 6/2005 | Ishii | |
| 6,933,165 B2 | 8/2005 | Musolf et al. | |
| 6,979,872 B2 | 12/2005 | Borwick | |
| 7,019,434 B2 | 3/2006 | Helmbrecht | |
| 7,095,226 B2 | 8/2006 | Wan et al. | |
| 7,145,555 B2 | 12/2006 | Taylor et al. | |
| 7,183,630 B1* | 2/2007 | Fogelson et al. | 257/666 |
| 7,193,312 B2* | 3/2007 | Boon et al. | 257/690 |
| 7,195,945 B1 | 3/2007 | Edelstein et al. | |
| 7,239,000 B2 | 7/2007 | Witcraft | |
| 7,253,079 B2 | 8/2007 | Hanson et al. | |
| 7,258,009 B2 | 8/2007 | Imai | |
| 7,370,530 B2 | 5/2008 | DCamp et al. | |
| 7,391,091 B2 | 6/2008 | Tondra | |
| 7,402,449 B2 | 7/2008 | Fukuda et al. | |
| 7,430,674 B2 | 9/2008 | Van Mueller et al. | |
| 7,453,269 B2 | 11/2008 | Won et al. | |
| 7,454,705 B2 | 11/2008 | Cadez et al. | |
| 7,456,042 B2 | 11/2008 | Stark | |
| 7,493,496 B2 | 2/2009 | Smith et al. | |
| 7,498,715 B2 | 3/2009 | Yang | |
| 7,511,379 B1* | 3/2009 | Flint, Jr. | 257/774 |
| 7,521,783 B2 | 4/2009 | Tsai et al. | |
| 7,536,909 B2 | 5/2009 | Zhao et al. | |
| 7,585,750 B2* | 9/2009 | Do et al. | 438/462 |
| 7,676,340 B2 | 3/2010 | Yasui | |
| 7,690,255 B2 | 4/2010 | Gogoi et al. | |
| 7,708,189 B1 | 5/2010 | Cipriano | |
| 7,713,785 B1 | 5/2010 | Flint | |
| 7,779,689 B2 | 8/2010 | Li et al. | |
| 7,814,791 B2 | 10/2010 | Andersson et al. | |
| 7,814,792 B2 | 10/2010 | Tateyama et al. | |
| 7,814,793 B2 | 10/2010 | Sato | |
| 7,861,422 B2 | 1/2011 | McDonald | |
| 7,891,103 B2 | 2/2011 | Mayor | |
| 8,011,577 B2 | 9/2011 | Mullen et al. | |
| 8,016,191 B2 | 9/2011 | Bonalle et al. | |
| 8,037,758 B2 | 10/2011 | Sato | |
| 8,056,412 B2 | 11/2011 | Rutkiewicz et al. | |
| 8,061,049 B2 | 11/2011 | Mayor | |
| 8,070,055 B2 | 12/2011 | Block et al. | |
| 8,087,296 B2 | 1/2012 | Ueda et al. | |
| 8,148,808 B2 | 4/2012 | Braden et al. | |
| 8,165,323 B2 | 4/2012 | Zhou | |
| 8,181,874 B1 | 5/2012 | Wan et al. | |
| 8,227,285 B1 | 7/2012 | Yang | |
| 8,236,577 B1 | 8/2012 | Hsu | |
| 8,245,923 B1 | 8/2012 | Merrill et al. | |
| 8,250,921 B2 | 8/2012 | Nasiri et al. | |
| 8,259,311 B2 | 9/2012 | Petschko | |
| 8,324,047 B1 | 12/2012 | Yang | |
| 8,342,021 B2 | 1/2013 | Oshio | |
| 8,367,522 B1 | 2/2013 | Yang | |
| 8,395,252 B1 | 3/2013 | Yang | |
| 8,395,381 B2 | 3/2013 | Lo | |
| 8,402,666 B1 | 3/2013 | Hsu et al. | |
| 8,407,905 B1 | 4/2013 | Hsu et al. | |
| 8,421,082 B1 | 4/2013 | Yang | |
| 8,476,084 B1 | 7/2013 | Yang et al. | |
| 8,476,129 B1 | 7/2013 | Jensen et al. | |
| 8,477,473 B1 | 7/2013 | Koury et al. | |
| 8,486,723 B1 | 7/2013 | Wan et al. | |
| 2001/0053565 A1 | 12/2001 | Khoury | |
| 2002/0072163 A1 | 6/2002 | Wong et al. | |
| 2002/0134837 A1 | 9/2002 | Kishon | |
| 2003/0058069 A1 | 3/2003 | Schwartz et al. | |
| 2003/0095115 A1 | 5/2003 | Brian et al. | |
| 2003/0184189 A1 | 10/2003 | Sinclair | |
| 2003/0230802 A1* | 12/2003 | Poo et al. | 257/734 |
| 2004/0002808 A1 | 1/2004 | Hashimoto et al. | |
| 2004/0016995 A1 | 1/2004 | Kuo et al. | |
| 2004/0017644 A1 | 1/2004 | Goodwin-Johansson | |
| 2004/0056742 A1 | 3/2004 | Dabbaj | |
| 2004/0063325 A1 | 4/2004 | Urano et al. | |
| 2004/0104268 A1 | 6/2004 | Bailey | |
| 2004/0113246 A1 | 6/2004 | Boon | |
| 2004/0119836 A1 | 6/2004 | Kitaguchi et al. | |
| 2004/0140962 A1 | 7/2004 | Wang et al. | |
| 2004/0177045 A1 | 9/2004 | Brown | |
| 2004/0207035 A1 | 10/2004 | Witcraft et al. | |
| 2004/0227201 A1 | 11/2004 | Borwick, III et al. | |
| 2005/0074147 A1 | 4/2005 | Smith et al. | |
| 2005/0090038 A1* | 4/2005 | Wallace | 438/106 |
| 2005/0174338 A1 | 8/2005 | Ing | |
| 2005/0247787 A1 | 11/2005 | Von Mueller et al. | |
| 2006/0049826 A1 | 3/2006 | Daneman et al. | |
| 2006/0081954 A1 | 4/2006 | Tondra et al. | |
| 2006/0141786 A1 | 6/2006 | Boezen et al. | |
| 2006/0168832 A1 | 8/2006 | Yasui et al. | |
| 2006/0192465 A1 | 8/2006 | Kornbluh et al. | |
| 2006/0208326 A1 | 9/2006 | Nasiri et al. | |
| 2006/0211044 A1 | 9/2006 | Green | |
| 2006/0238621 A1 | 10/2006 | Okubo et al. | |
| 2006/0243049 A1 | 11/2006 | Ohta et al. | |
| 2006/0274399 A1 | 12/2006 | Yang | |
| 2007/0132733 A1 | 6/2007 | Ram | |
| 2007/0152976 A1 | 7/2007 | Townsend et al. | |
| 2007/0181962 A1 | 8/2007 | Partridge et al. | |
| 2007/0200564 A1 | 8/2007 | Motz et al. | |
| 2007/0281379 A1 | 12/2007 | Stark et al. | |
| 2008/0014682 A1 | 1/2008 | Yang et al. | |
| 2008/0066547 A1 | 3/2008 | Tanaka et al. | |
| 2008/0110259 A1 | 5/2008 | Takeno | |
| 2008/0119000 A1 | 5/2008 | Yeh et al. | |
| 2008/0123242 A1 | 5/2008 | Zhou | |
| 2008/0210007 A1 | 9/2008 | Yamaji et al. | |
| 2008/0211043 A1 | 9/2008 | Chen | |
| 2008/0211113 A1 | 9/2008 | Chua et al. | |
| 2008/0277747 A1 | 11/2008 | Ahmad | |
| 2008/0283991 A1 | 11/2008 | Reinert | |
| 2009/0007661 A1 | 1/2009 | Nasiri et al. | |
| 2009/0049911 A1 | 2/2009 | Fukuda et al. | |
| 2009/0108440 A1 | 4/2009 | Meyer et al. | |
| 2009/0115412 A1 | 5/2009 | Fuse | |
| 2009/0153500 A1 | 6/2009 | Cho et al. | |
| 2009/0262074 A1 | 10/2009 | Nasiri et al. | |
| 2009/0267906 A1 | 10/2009 | Schroderus | |
| 2009/0321510 A1 | 12/2009 | Day et al. | |
| 2010/0044121 A1 | 2/2010 | Simon et al. | |
| 2010/0071467 A1 | 3/2010 | Nasiri et al. | |
| 2010/0075481 A1 | 3/2010 | Yang | |
| 2010/0083756 A1 | 4/2010 | Merz et al. | |
| 2010/0109102 A1 | 5/2010 | Chen et al. | |
| 2010/0208118 A1 | 8/2010 | Ueyama | |
| 2010/0236327 A1 | 9/2010 | Mao | |
| 2010/0248662 A1 | 9/2010 | Sheynblat et al. | |
| 2010/0260388 A1 | 10/2010 | Garret et al. | |
| 2010/0302199 A1 | 12/2010 | Taylor et al. | |
| 2010/0306117 A1 | 12/2010 | Terayoko | |
| 2010/0307016 A1 | 12/2010 | Mayor et al. | |
| 2010/0312519 A1 | 12/2010 | Huang et al. | |
| 2011/0131825 A1 | 6/2011 | Mayor et al. | |
| 2011/0146401 A1 | 6/2011 | Inaguma et al. | |
| 2011/0154905 A1 | 6/2011 | Hsu | |
| 2011/0172918 A1 | 7/2011 | Tome | |
| 2011/0183456 A1 | 7/2011 | Hsieh et al. | |
| 2011/0198395 A1 | 8/2011 | Chen | |
| 2011/0265574 A1 | 11/2011 | Yang | |
| 2011/0266340 A9 | 11/2011 | Block et al. | |
| 2011/0312349 A1 | 12/2011 | Forutanpour et al. | |
| 2012/0007597 A1 | 1/2012 | Seeger et al. | |
| 2012/0007598 A1 | 1/2012 | Lo et al. | |
| 2012/0215475 A1 | 8/2012 | Rutledge et al. | |

* cited by examiner

METHOD AND STRUCTURE OF INTEGRATED MICRO ELECTRO-MECHANICAL SYSTEMS AND ELECTRONIC DEVICES USING EDGE BOND PADS

CROSS-REFERENCES TO RELATED APPLICATIONS

The present application is a divisional application of U.S. patent application Ser. No. 13/082,384, filed Apr. 7, 2011, which claims priority to U.S. Pat. App. No. 61/322,198, filed Apr. 8, 2010, both of which are incorporated by reference for all purposes. The present invention also incorporates by reference, for all purposes, the following co-pending patent applications: U.S. patent application Ser. No. 12/859,631, filed Aug. 19, 2010, U.S. patent application Ser. No. 12/490,067, filed Jun. 23, 2009, U.S. patent application Ser. No. 12/945,087, filed Nov. 12, 2010, and U.S. patent application Ser. No. 12/913,440, filed Oct. 27, 2010.

BACKGROUND OF THE INVENTION

The present invention relates generally to integrated devices. More particularly, the present invention provides a method for fabricating an integrated electronic device using edge bond pads as well as a device using edge bond pads. More specifically, the present invention provides a method for forming a passivation material and a conduction material overlying one or more integrated micro electronic mechanical systems, commonly termed "MEMS" or devices formed overlying a substrate as well as the resulting device. Merely by way of example, the integrated device can include at least an accelerometer, an angular rate sensor, a magnetic field sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS technology has limitless applications through modular measurement devices such as accelerometers, angular rate sensors, actuators, and other sensors. In conventional vehicles, accelerometers and angular rate sensors are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices and systems are provided. More particularly, the present invention provides a method for fabricating an integrated electronic device using edge bond pads as well as a device using edge bond pads. More specifically, the present invention provides a method for forming a passivation material and a conduction material overlying one or more integrated micro electro mechanical systems and electronic devices formed overlying a substrate as well as the resulting device. Merely by way of example, the integrated device can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

In a specific embodiment, the present invention provides a method for fabricating an integrated electronic device using edge bond pads as well as a device using edge bond pads device. The method includes providing a substrate having a surface region and forming one or more integrated micro electro-mechanical systems and electronic devices on a first region overlying the surface region. Each of the integrated micro electro-mechanical systems and electronic devices can have one or more contact regions. The first region can also have a first surface region. One or more trench structures can be formed within one or more portions of the first region. A passivation material can be formed overlying the first region and the one or more trench structures. One or more portions of the passivation material can be removed within a vicinity of one or more of the contact regions. A conduction material can be formed overlying the passivation material, the one or more trench structures, and one or more of the contact regions. One or more portions of the conduction material can be removed within a vicinity of one or more of the contact regions to form one or more bond pad structures. The resulting device can then be singulated within a vicinity of the one or more bond pad structures to form two or more integrated micro electro-mechanical systems and electronic devices having edge bond pads.

In a specific embodiment, the device includes a substrate having a surface region and one or more integrated micro electro-mechanical systems and electronic devices on a first region overlying the surface region. Each of the integrated micro electro-mechanical systems and electronic devices can have one or more contact regions. The first region can also have a first surface region. The device can also have one or more trench structures within one or more portions of the first region. The device can have a passivation material overlying the first region and the one or more trench structures. The passivation material can have one or more portions removed within a vicinity of one or more of the contact regions. The device can have a conduction material overlying the passivation material, the one or more trench structures, and one or more of the contact regions. The device can also have one or more portions of the conduction material removed within a vicinity of one or more of the contact regions to form one or more bond pad structures. The device can also have one or more edge bond pad structures within a vicinity of the one or more bond pad structures. The one or more edge bond pad structures can be formed by a singulation process within a vicinity of the one or more bond pad structures.

Many benefits are achieved by way of the present invention over conventional techniques. For example, the present technique provides an easy to use process that relies upon conventional technology. In some embodiments, the method provides higher device yields in dies per wafer with the integrated approach or provides for easier integration of a fabricated device with other devices. Additionally, the method provides a process and system that are compatible with conventional process technology without substantial modifications to conventional equipment and processes. Preferably, the invention provides for an improved MEMS device system and related applications for a variety of uses. In one or more embodiments, the present invention provides for all MEMS and related applications, which may be integrated on one or more CMOS device structures. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow

DETAILED DESCRIPTION OF THE INVENTION

According to the present invention, techniques related generally to integrated devices and systems are provided. More particularly, the present invention provides a method for fabricating an integrated electronic device using edge bond pads. More specifically, the present invention provides a method for patterning one or more semiconductor layers to form one or more air dielectric regions within an integrated CMOS and MEMS device. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
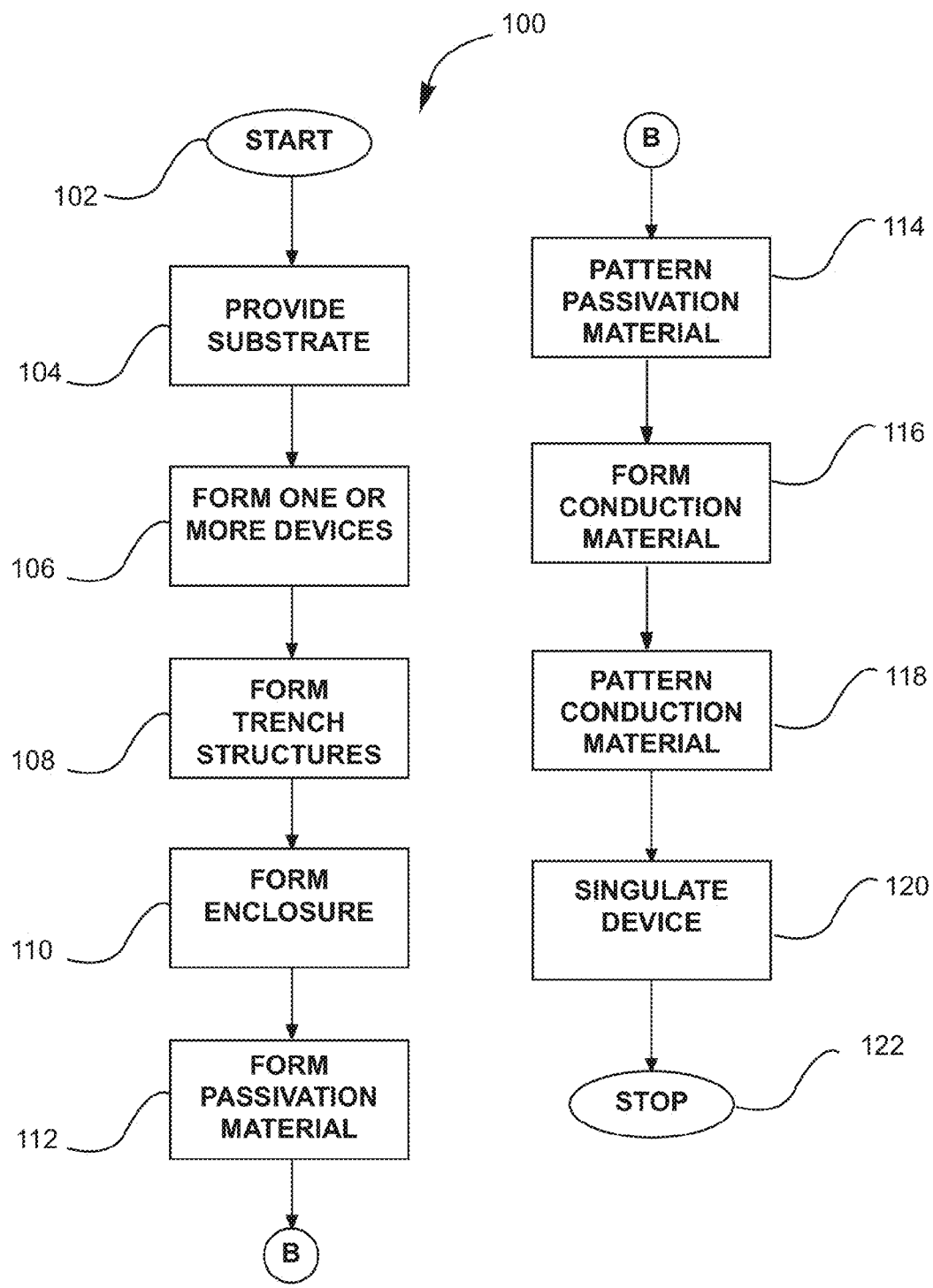
FIG. 1 is a simplified flow diagram of a method for fabricating an integrated electronic device according to an embodiment of the present invention.

FIG. 1 is a simplified flow diagram illustrating a method of fabricating an integrated electronic device using edge bond pads according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 1, the present method can be briefly outlined below.

1. Start;
2. Provide a substrate having a surface region;
3. Form one or more devices within a first region overlying the surface region;
4. Form one or more trench structures within the first region;
5. Form an enclosure housing the devices;
6. Form a passivation material overlying the first region;
7. Remove one or more portions of the passivation material;
8. Form a conduction material overlying the passivation material;
9. Remove one or more portions of the conduction material;
10. Singulate resulting device; and
11. Stop.

These steps are merely examples and should not unduly limit the scope of the claims herein. As shown, the above method provides a way of fabricating an integrated electronic device using edge bond pads according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 1, method 100 begins at start, step 102. The present method provides a fabrication method for forming an integrated electronic device using edge bond pads. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved integrated micro electromechanical systems and electronic devices and related methods for a variety of uses. Depending upon the embodiment, one or more of these benefits may be achieved. These and other benefits will be described in more throughout the present specification and more particularly below.

Following step 102, fabrication method 100 involves providing a substrate having a surface region, step 104. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, the substrate can have a surface region and a first region can be a region overlying the surface region. One or more integrated micro electro-mechanical systems and electronic devices can be formed on the first region overlying the surface region, step 106. The first region can have a first surface region. In a specific embodiment, the one or more integrated micro electro-mechanical systems and electronic devices can include transistor devices, metal layers, via structures, and others. The integrated micro electro-mechanical systems and electronic devices can also include a conduction material, a metal material, a metal alloy material, an insulating material, a dielectric material, or other materials or combinations thereof. Additionally, the integrated micro electro-mechanical systems and electronic devices can include integrated CMOS circuit devices, MEMS devices, anisotropic magnetic resonance (AMR) devices, or other devices or combinations thereof. In further embodiments, additional transistors, metal layers, and structures can be added. Each of the integrated micro electro-mechanical systems and electronic devices can have one or more contact regions. Each of the contact regions can include one or more bond pads, bonding structures, or conductive regions, as well as others. The fabrication of the one or more integrated micro electro-mechanical systems and electronic devices can be done through foundry-compatible processes. Of course, there can be other variations, modifications, and alternatives.

Following the formation of integrated micro electro-mechanical systems and electronic devices, one or more trench structures can be formed within one or more portions of the first region, step 108. In an embodiment, the one or more trench structures can be formed from a wet etching, dry etching, or mechanical process. In a specific embodiment, the one or more trench structures can be formed from a deep reactive-ion etching (DRIE) process. As stated previously, there can be other variations, modifications, and alternatives.

After the one or more trench structures are formed, an enclosure can be formed to house the one or more integrated micro electro-mechanical systems and electronic devices, step 110. The enclosure can include a silicon material, an insulating material, or other material or combination thereof. Following the formation of the enclosure, a passivation material can be formed overlying the first region the one or more trench structures, the enclosure, and one or more of the contact regions, step 112. In a specific embodiment, the passivation material can include an insulating material. The insulating material can include a dielectric material, or other material or combination thereof. One or more portions of the passivation material can also be removed within a vicinity of one or more of the contact regions of the integrated micro electromechanical systems and electronic devices and the one or more trench structures, step 114. In a specific embodiment, the removal process of the passivation material can include a patterning process, or an etching process, or other processes. Again, there can be other variations, modifications, and alternatives.

A conduction material can then be formed overlying the first region the one or more trench structures, the enclosure, and one or more of the contact regions step 116. In a specific embodiment, the conduction material can include a metal material, a metal alloy, other conductive materials or combinations thereof. One or more portions of the conduction material can also be removed within a vicinity of one or more of the contact regions of the integrated micro electro-mechanical systems and electronic devices and the one or more trench structures to form one or more bond pad structures, step 118. In a specific embodiment, the removal process of the conduction material can include a patterning process, or an etching process, or other processes. Again, there can be other variations, modifications, and alternatives.

Once the passivation material and the conduction material have been formed and patterned, the resulting device can be singulated within a vicinity of the one or more bond pad structures to form two or more integrated devices having one or more edge bond pad structures. In an embodiment, the singulation process can include a dicing, an etching, or a laser scribing process. Of course, there can be other variations, modifications, and alternatives.

The above sequence of processes provides a fabrication method for forming an integrated electronic device using edge bond pads according to an embodiment of the present invention. As shown, the method uses a combination of steps including providing a substrate, forming integrated micro electro-mechanical systems and electronic devices, forming an enclosure, forming a passivation material, removing one or more portions of the passivation material, forming a conduction material, removing one or more portions of the conduction material, and singulating the resulting device. Other alternatives can also be provided where steps are added, one or more steps are removed, or one or more steps are provided in a different sequence without departing from the scope of the claims herein. Further details of the present method can be found throughout the present specification.

Figure 2:
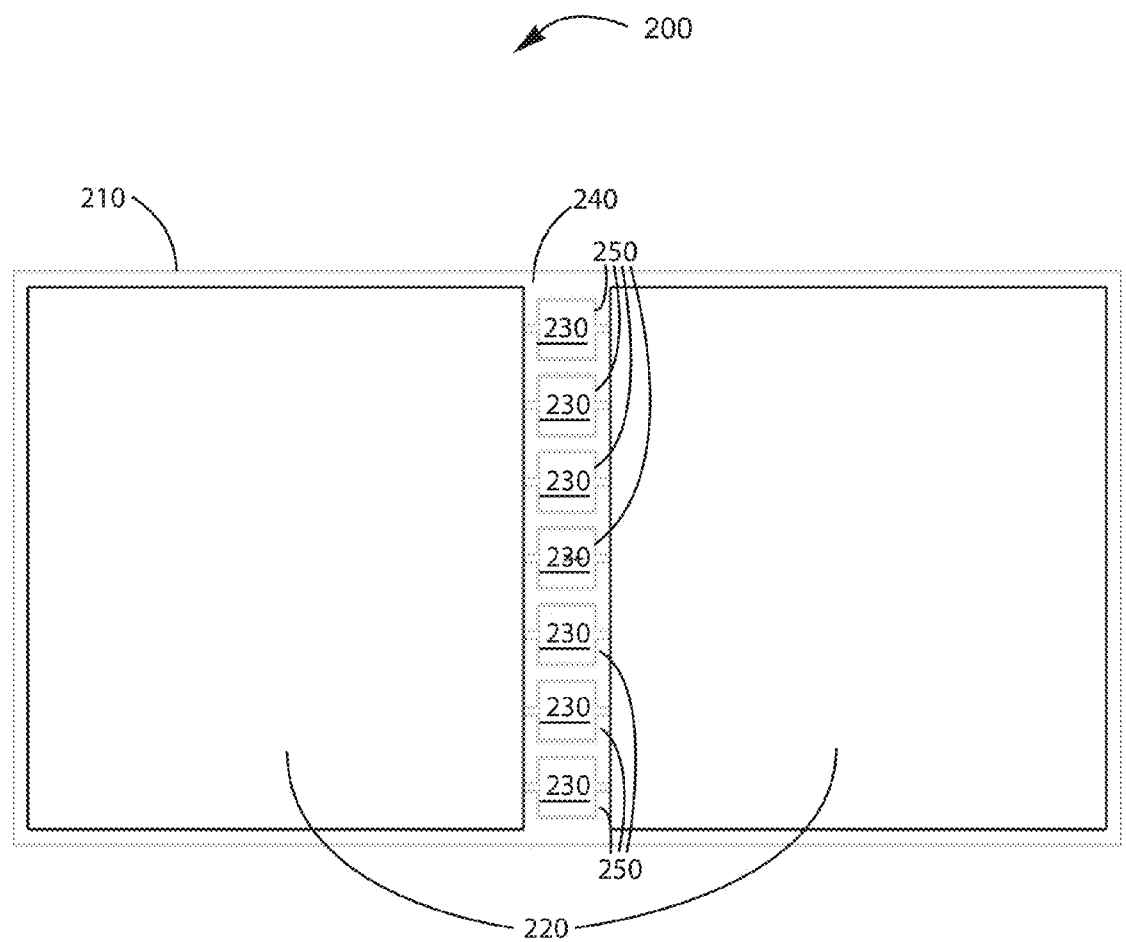
FIG. 2 is a simplified top diagram of an integrated electronic device according to an embodiment of the present invention.

FIG. 2 is a simplified top diagram of an integrated electronic device according to an embodiment of the present invention. This diagram is merely an example, which should not unduly limit the scope of the claims herein. One of ordinary skill in the art would recognize many other variations, modifications, and alternatives. As shown, device 200 includes a substrate 210, one or more integrated micro electro-mechanical systems and electronic devices 220, one or more trench structures 230, a passivation layer 240, and a conduction layer 250. Device 200 shown in this figure can represent an integrated electronic device prior to singulation, as referred to previously in FIG. 1. Those skilled in the art will recognize other variations, modifications, and alternatives.

In an embodiment, substrate 210 can have a surface region. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, one or more integrated micro electromechanical systems and electronic devices 220 can be formed on a first region overlying the surface region. The first region can have a first surface region. In a specific embodiment, one or more integrated micro electro-mechanical systems and electronic devices 220 can include transistor devices, metal layers, via structures, and others. Integrated micro electro-mechanical systems and electronic devices 220 can also include a conduction material, a metal material, a metal alloy material, an insulating material, a dielectric material, or other materials or combinations thereof. Additionally, integrated micro electro-mechanical systems and electronic devices 220 can include integrated CMOS circuit devices, MEMS devices, anisotropic magnetic resonance (AMR) devices, or other devices or combinations thereof. In further embodiments, additional transistors, metal layers, and structures can be added. Each of integrated micro electro-mechanical systems and electronic devices 220 can have one or more contact regions. Each of the contact regions can include one or more bond pads, bonding structures, or conductive regions, as well as others. The fabrication of one or more integrated micro electro-mechanical systems and electronic devices 220 can be done through foundry-compatible processes. Of course, there can be other variations, modifications, and alternatives.

In an embodiment, one or more trench structures 230 can be formed within one or more portions of the first region. In a specific embodiment, one or more trench structures 230 can be formed from a wet etching, dry etching, or mechanical process. Also, one or more trench structures 230 can be formed from a deep reactive-ion etching (DRIE) process. As stated previously, there can be other variations, modifications, and alternatives.

Device 200 can also have an enclosure formed to house one or more integrated micro electro-mechanical systems and electronic devices 220. The enclosure can include a silicon material, an insulating material, or other material or combination thereof. In an embodiment, passivation material 240 can be formed overlying the first region one or more trench structures 230, the enclosure, and one or more of the contact regions. In a specific embodiment, passivation material 240 can include an insulating material. The insulating material can include a dielectric material, or other material or combination thereof. One or more portions of passivation material 240 can also be removed within a vicinity of one or more of the contact regions of integrated micro electro-mechanical systems and electronic devices 220 and one or more trench structures 230. In a specific embodiment, the removal process of passivation material 240 can include a patterning process, or an etching process, or other processes. Again, there can be other variations, modifications, and alternatives.

In an embodiment, conduction material 250 can include a metal material, a metal alloy, other conductive materials or combinations thereof. One or more portions of conduction material 250 can also be removed within a vicinity of one or more of the contact regions of integrated micro electro-mechanical systems and electronic devices 220 and one or more trench structures 230 to form one or more bond pad structures. In a specific embodiment, the removal process of conduction material 250 can include a patterning process, or an etching process, or other processes. Again, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
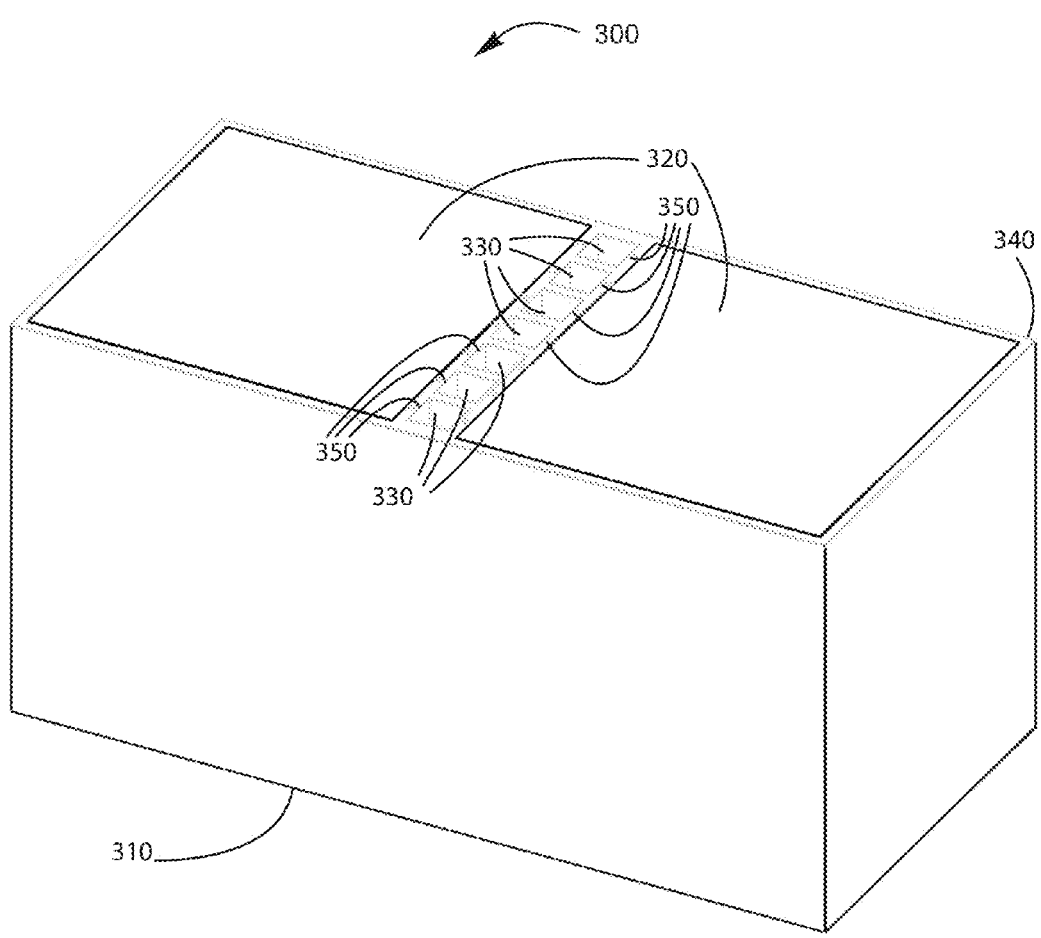
FIG. 3 is a simplified perspective diagram of an integrated electronic device according to an embodiment of the present invention.

FIG. 3 is a simplified perspective diagram of a sensor device or electronic device according to an embodiment of the present invention. More particularly, FIG. 3 illustrates device 300 prior to singulation. This diagram is merely an example, which should not unduly limit the scope of the claims herein. One of ordinary skill in the art would recognize many other variations, modifications, and alternatives. As shown, device 300 includes a first substrate member 310, at least one sensor or electronic device 320, at least one trench structure(s) 330, a dielectric layer 340, and a conduction layer 350. Device 300 shown in this figure can represent a sensor device or electronic device prior to singulation, as referred to previously in FIG. 1. A detailed description regarding the structure and the elements device 300 can be found above in the description for FIG. 2. Features of this embodiment are more clearly shown in close-up 301. Those skilled in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
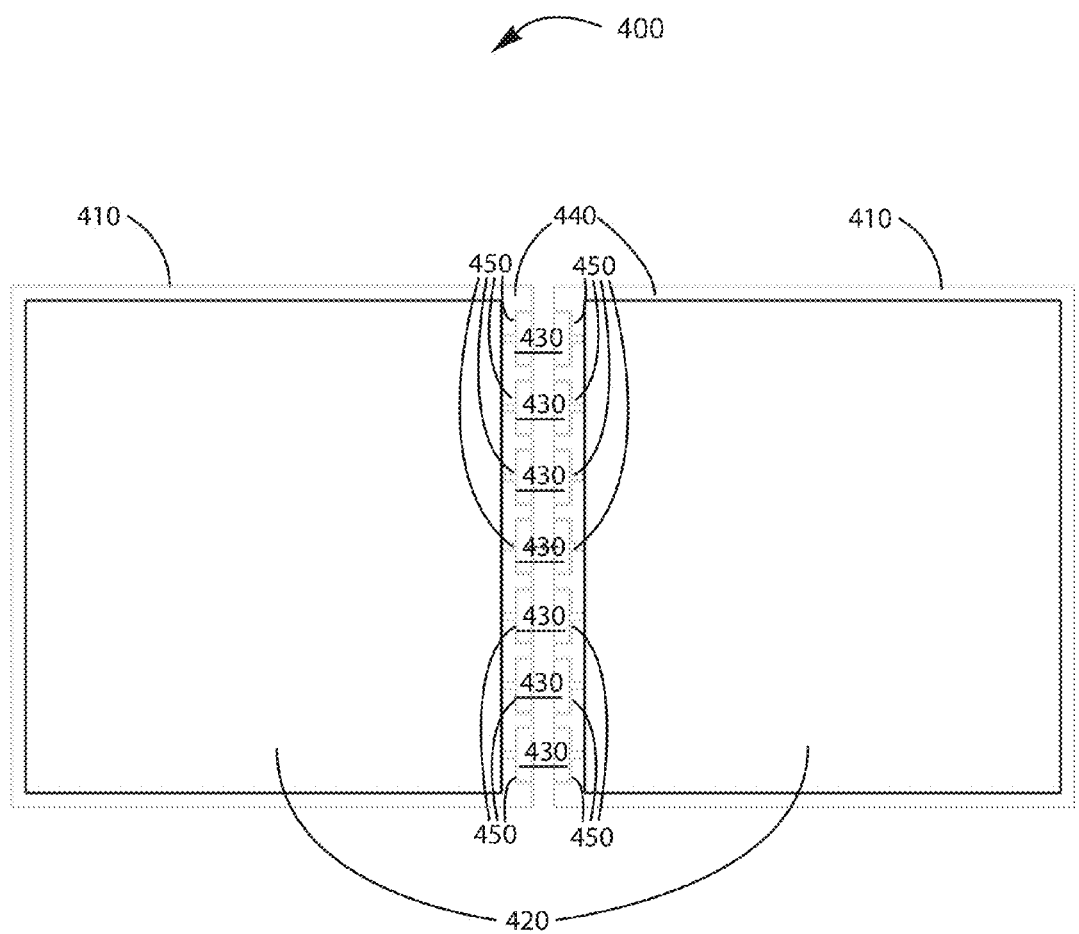
FIG. 4 is a simplified top diagram of an integrated electronic device according to an embodiment of the present invention.

FIG. 4 is a simplified top diagram of an integrated electronic device according to an embodiment of the present invention. This diagram is merely an example, which should not unduly limit the scope of the claims herein. One of ordinary skill in the art would recognize many other variations, modifications, and alternatives. As shown, device 400 includes a substrate 410, one or more integrated micro electro-mechanical systems and electronic devices 420, one or more trench structures 430, a passivation layer 440, a conduction layer 450, and one or more edge bond pad structures. Device 400 shown in this figure can represent an integrated electronic device following singulation, as referred to previously in FIG. 1. Those skilled in the art will recognize other variations, modifications, and alternatives.

In an embodiment, substrate 410 can have a surface region. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, one or more integrated micro electro-mechanical systems and electronic devices 420 can be formed on a first region overlying the surface region. The first region can have a first surface region. In a specific embodiment, one or more integrated micro electromechanical systems and electronic devices 420 can include transistor devices, metal layers, via structures, and others. Integrated micro electro-mechanical systems and electronic devices 420 can also include a conduction material, a metal material, a metal alloy material, an insulating material, a dielectric material, or other materials or combinations thereof. Additionally, integrated micro electro-mechanical systems and electronic devices 420 can include integrated CMOS circuit devices, MEMS devices, anisotropic magnetic resonance (AMR) devices, or other devices or combinations thereof. In further embodiments, additional transistors, metal layers, and structures can be added. Each of integrated micro electro-mechanical systems and electronic devices 420 can have one or more contact regions. Each of the contact regions can include one or more bond pads, bonding structures, or conductive regions, as well as others. The fabrication of one or more integrated micro electro-mechanical systems and electronic devices 420 can be done through foundry-compatible processes. Of course, there can be other variations, modifications, and alternatives.

In an embodiment, one or more trench structures 430 can be formed within one or more portions of the first region. In a specific embodiment, one or more trench structures 430 can be formed from a wet etching, dry etching, or mechanical process. Also, one or more trench structures 430 can be formed from a deep reactive-ion etching (DRIE) process. As stated previously, there can be other variations, modifications, and alternatives.

Device 400 can also have an enclosure formed to house one or more integrated micro electro-mechanical systems and electronic devices 420. The enclosure can include a silicon material, an insulating material, or other material or combination thereof. In an embodiment, passivation material 440 can be formed overlying the first region one or more trench structures 430, the enclosure, and one or more of the contact regions. In a specific embodiment, passivation material 440 can include an insulating material. The insulating material can include a dielectric material, or other material or combination thereof. One or more portions of passivation material 440 can also be removed within a vicinity of one or more of the contact regions of integrated micro electro-mechanical systems and electronic devices 420 and one or more trench structures 430. In a specific embodiment, the removal process of passivation material 440 can include a patterning process, or an etching process, or other processes. Again, there can be other variations, modifications, and alternatives.

In an embodiment, conduction material 450 can include a metal material, a metal alloy, other conductive materials or combinations thereof. One or more portions of conduction material 450 can also be removed within a vicinity of one or more of the contact regions of integrated micro electro-mechanical systems and electronic devices 420 and one or more trench structures 430 to form one or more bond pad structures. In a specific embodiment, the removal process of conduction material 450 can include a patterning process, or an etching process, or other processes. Again, there can be other variations, modifications, and alternatives.

In an embodiment, the one or more edge bond pads can be operably coupled to the conduction material 450 and the passivation material 440. In a specific embodiment, the one or more edge bond pad structures can be formed by a singulation process within a vicinity of the one or more bond pad structures. In an embodiment, the singulation process can include a dicing, an etching, or a laser scribing process. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
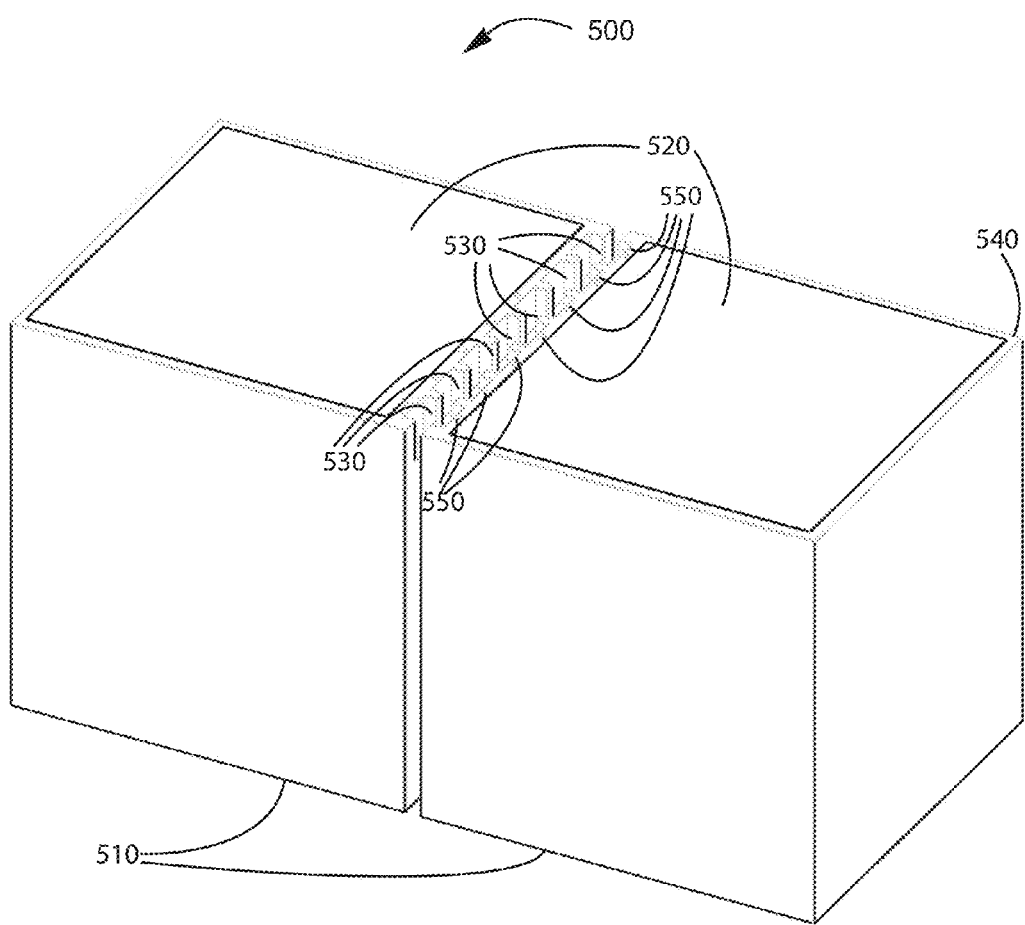
FIG. 5 is a simplified perspective diagram of an integrated electronic device according to an embodiment of the present invention.

FIG. 5 is a simplified perspective diagram of an integrated electronic device according to an embodiment of the present invention. This diagram is merely an example, which should not unduly limit the scope of the claims herein. One of ordinary skill in the art would recognize many other variations, modifications, and alternatives. As shown, device 500 includes a substrate 510, one or more integrated micro electro-mechanical systems and electronic devices 520, one or more trench structures 530, a passivation layer 540, a conduction layer 550, and one or more edge bond pad structures. Device 500 shown in this figure can represent an integrated electronic device following singulation, as referred to previously in FIG. 1. A detailed description regarding the structure and the elements device 500 can be found above in the description for FIG. 4. Those skilled in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
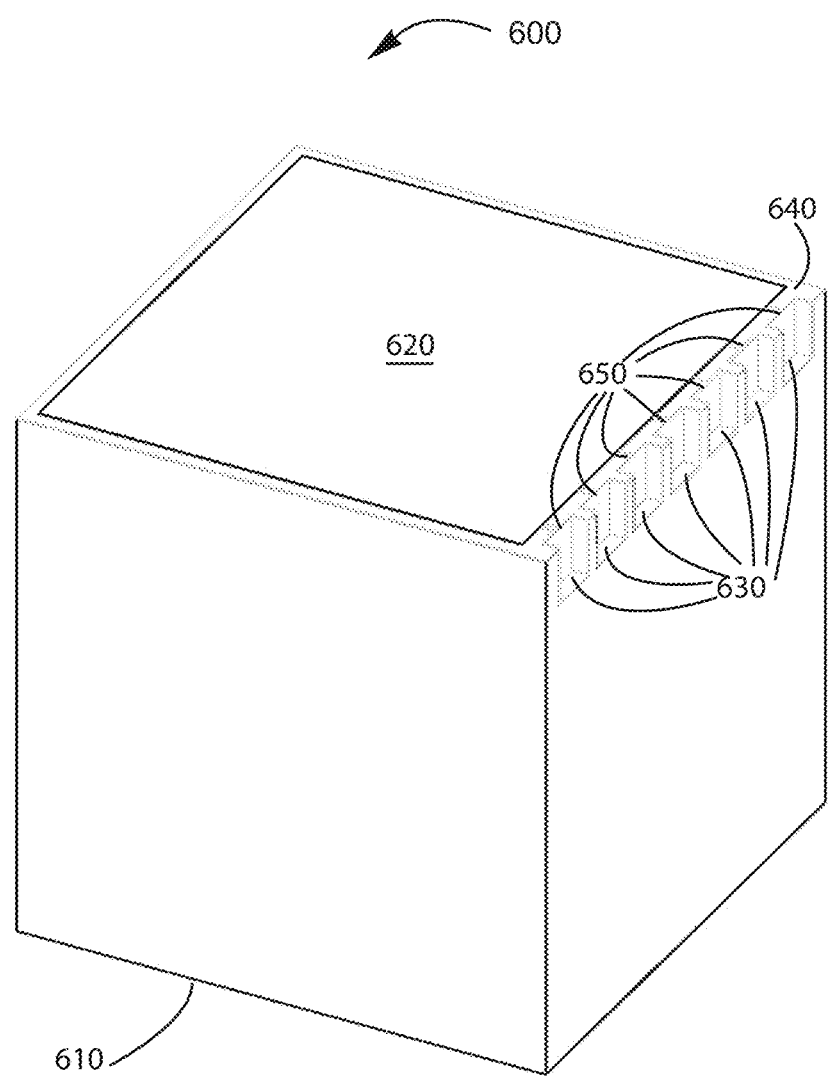
FIG. 6 is a simplified perspective diagram of an integrated electronic device according to an embodiment of the present invention.

FIG. 6 is a simplified perspective diagram of an integrated electronic device according to an embodiment of the present invention. This diagram is merely an example, which should not unduly limit the scope of the claims herein. One of ordinary skill in the art would recognize many other variations, modifications, and alternatives. As shown, device 600 includes a substrate 610, one or more integrated micro electro-mechanical systems and electronic devices 620, one or more trench structures 630, a passivation layer 640, a conduction layer 650, and one or more edge bond pad structures. A detailed description regarding the structure and the elements device 600 can be found above in the description for FIG. 4. Features of this embodiment are shown more clearly in close-up 601. Those skilled in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A monolithic integrated electronic device, the device comprising:
    a substrate having a surface region;
    one or more integrated micro electromechanical systems and electronic devices provided on a first region overlying the surface region, each of the integrated micro electro-mechanical systems and electronic devices having one or more contact regions, the first region having a first surface region;
    one or more trench structures within one or more portions of the first region;
    a passivation material overlying the first region and the one or more trench structures, the passivation material having one or more portions removed within a vicinity of one or more of the contact regions;
    a conduction material overlying the passivation material, the one or more trench structures, and one or more of the contact regions, the conduction material having one or more portions of the conduction material removed within a vicinity of one or more of the contact regions and the one or more trench structures to form one or more bond pad structures; and
    one or more edge bond pad structures within a vicinity of the one or more bond pad structures, the one or more edge bond pad structures being formed by a singulation process within a vicinity of the one or more bond pad structures.

2. The device of claim 1 wherein the one or more integrated micro electro-mechanical systems and electronic devices comprise one or more devices selected from a group consisting of: CMOS integrated circuit devices, MEMS devices, and anisotropic magnetoresistance (AMR) devices.

3. The device of claim 1 wherein the one or more contact regions comprise one or more bond pads, bonding structures, or conductive regions.

4. The device of claim 1 wherein the one or more trench structures are formed from a wet etching, dry etching, or mechanical process.

5. The device of claim 1 wherein the one or more trench structures are formed from a deep reactive-ion etching (DRIE) process.

6. The device of claim 1 wherein the passivation material comprises an insulating material or dielectric material.

7. The device of claim 1 wherein the removing of one or more portions of the passivation material comprises a wet etching, dry etching, or mechanical process.

8. The device of claim 1 wherein the conduction material comprises a metal layer or metal alloy layer.

9. The device of claim 1 wherein the removing of the one or more portions of the conduction material comprises a wet etching, dry etching, or mechanical process.

10. The device of claim 1 wherein the singulating of the resulting device comprises a dicing, an etching, or a laser scribing process.

* * * * *